United States Patent [19]
Griffin

[11] Patent Number: 6,081,423
[45] Date of Patent: Jun. 27, 2000

[54] POWER SUPPLY WITH OBLIQUELY IMPINGING AIRFLOW

[75] Inventor: David C. Griffin, Florence, S.C.

[73] Assignee: The Esab Group, Inc., Florence, S.C.

[21] Appl. No.: 09/218,980

[22] Filed: Dec. 22, 1998

[51] Int. Cl.$^7$ .................................................. H05K 7/20
[52] U.S. Cl. ................................................................ 361/688
[58] Field of Search .................................. 361/600, 668,
361/695, 699, 601, 622, 623, 641, 818,
836, 704–707, 717–719, 816; 174/35 R,
16.1, 35 MS; 219/61.7, 76.11, 86.31, 125.11,
126, 130.1, 130.51, 137 PS; 363/141, 146,
144; 307/150

[56] References Cited

U.S. PATENT DOCUMENTS

| | | |
|---|---|---|
| 2,974,263 | 3/1961 | Akins . |
| 3,305,704 | 2/1967 | Battista . |
| 3,567,902 | 3/1971 | Stearns et al. ............................ 219/131 |
| 4,027,205 | 5/1977 | Frederick . |
| 4,237,521 | 12/1980 | Denker . |
| 4,459,638 | 7/1984 | Brehm et al. . |
| 4,699,208 | 10/1987 | Wolf et al. . |
| 5,171,183 | 12/1992 | Pollard et al. . |
| 5,406,050 | 4/1995 | Macomber et al. . |
| 5,440,450 | 8/1995 | Lau et al. . |
| 5,592,366 | 1/1997 | Goldman et al. . |
| 5,642,260 | 6/1997 | Sigl ......................................... 361/695 |
| 5,745,041 | 4/1998 | Moss . |
| 5,747,773 | 5/1998 | Griffin et al. ........................... 219/130.1 |
| 5,757,638 | 5/1998 | Katooka et al. ......................... 363/146 |
| 5,831,240 | 11/1998 | Katooka et al. ....................... 219/130.1 |
| 5,901,167 | 5/1999 | Sukhman et al. ......................... 372/58 |
| 5,943,220 | 8/1999 | Shikata et al. ........................... 361/818 |

FOREIGN PATENT DOCUMENTS

| | | | |
|---|---|---|---|
| 409307034 | 11/1997 | Japan ............................ H01L 23/40 |
| 2 174 193 | 10/1986 | United Kingdom . |

*Primary Examiner*—Leo P. Picard
*Assistant Examiner*—Michael Datskovsky
*Attorney, Agent, or Firm*—Alston&Bird LLP

[57] ABSTRACT

A power supply includes a housing and an air moving device for moving cooling air along a flowpath extending through the housing. A heat sink extends in a longitudinal direction and is positioned within the flowpath so that an upstream section of the flowpath has a flow axis that defines an acute angle with respect to the longitudinal direction. Therefore, air flowing from the upstream section of the flowpath impinges upon and is deflected by the heat sink toward and along a downstream section of the flowpath that has a flow axis that extends approximately in the longitudinal direction. An electrical component to be cooled is positioned within the flowpath downstream from the heat sink. A second heat sink extends in the longitudinal direction and is laterally displaced from the first heat sink so that the flowpath extends between the first heat sink and the second heat sink. The upstream ends of the heat sinks define a staggered arrangement, which is characterized by the end of one of the heat sinks extending farther then the end of the other heat sink. That staggered arrangement allows for air flowing from the upstream section of the flowpath to impinge at an acute angle upon a substantial length of the first heat sink. The air moving device is positioned in a corner of the housing that is opposite from the staggered arrangement.

24 Claims, 6 Drawing Sheets

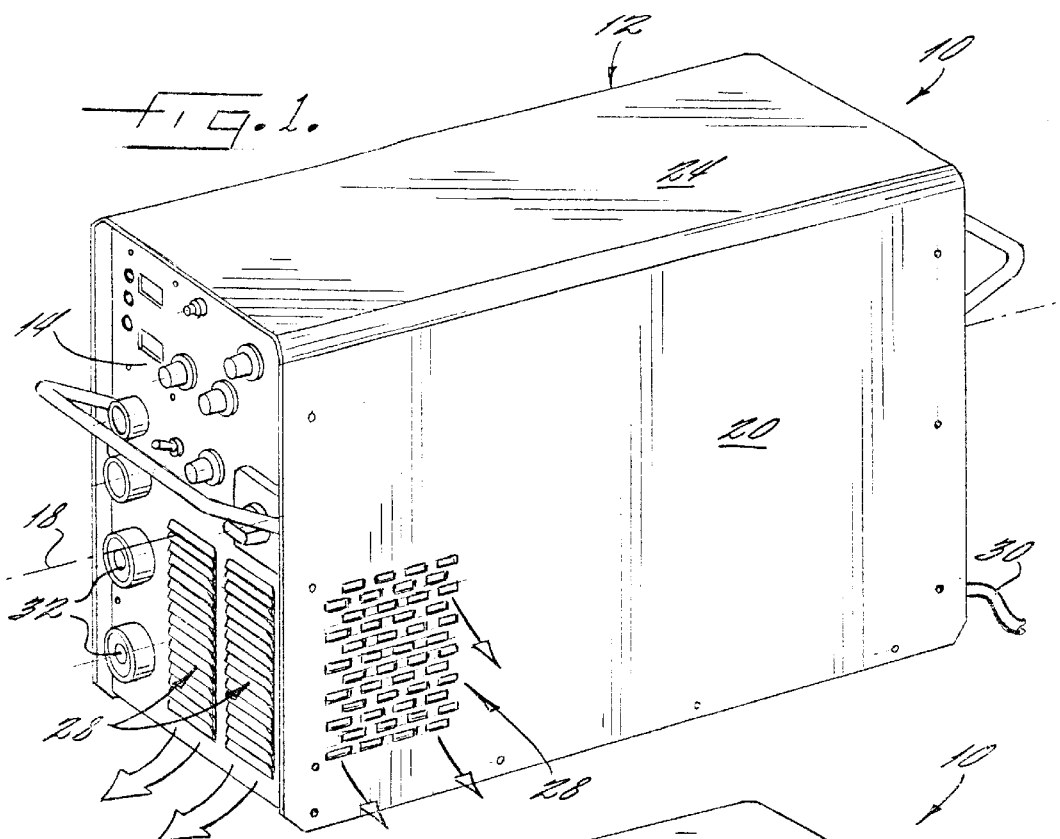
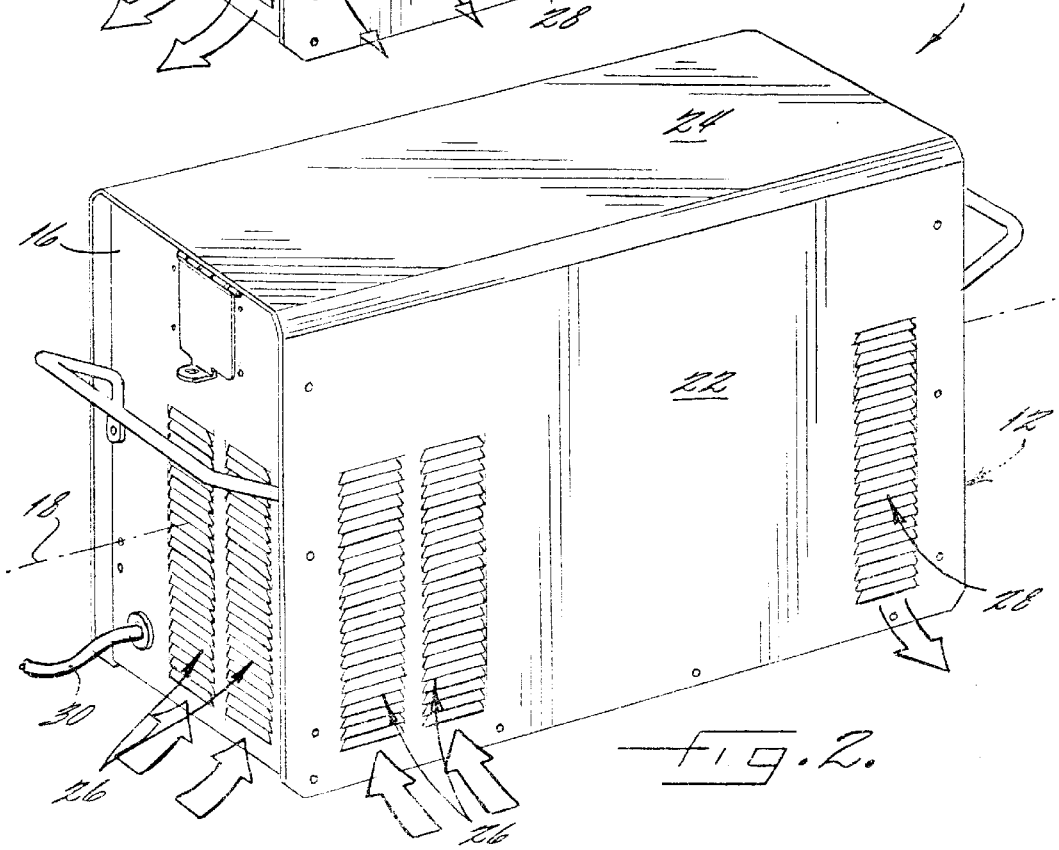

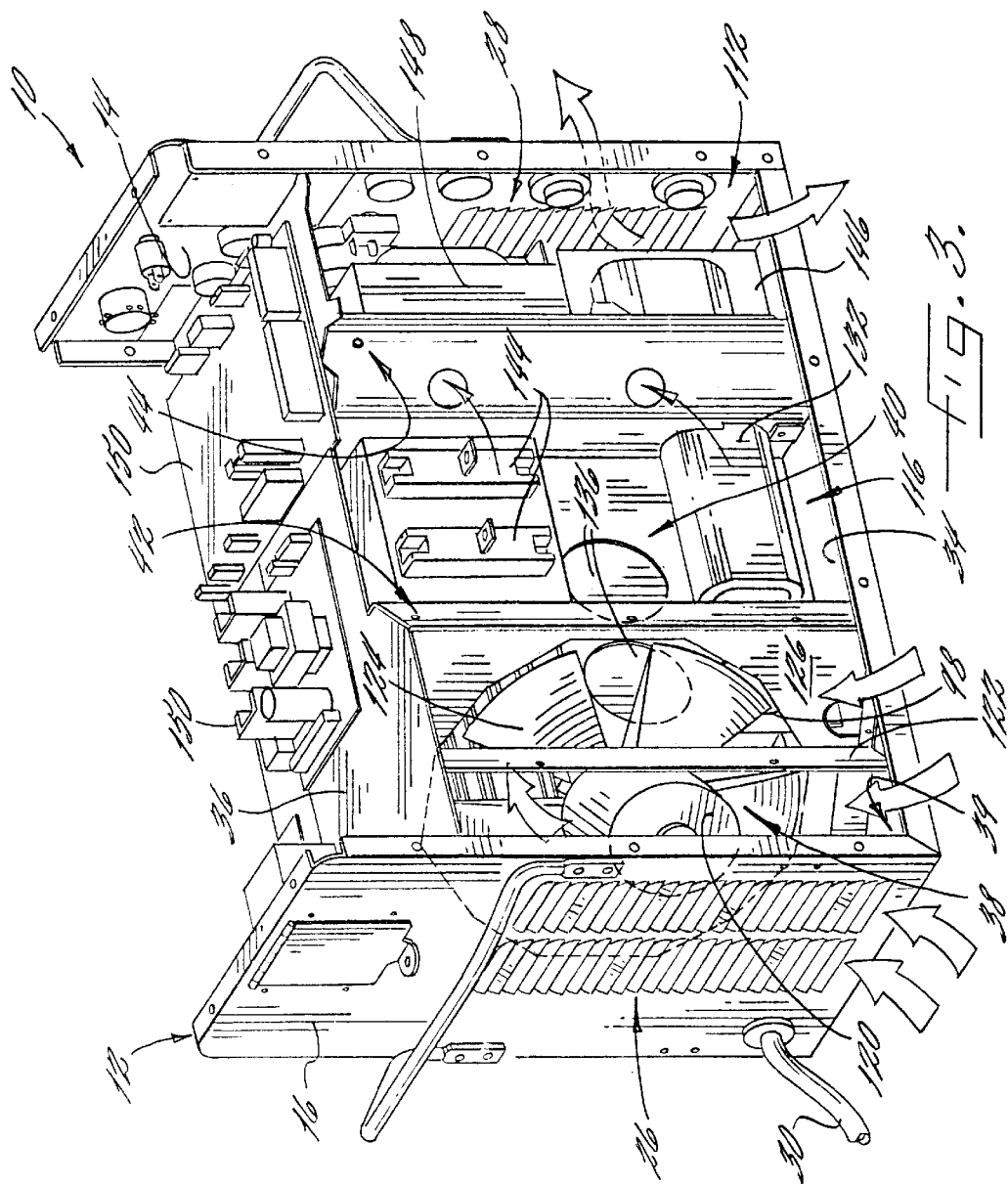

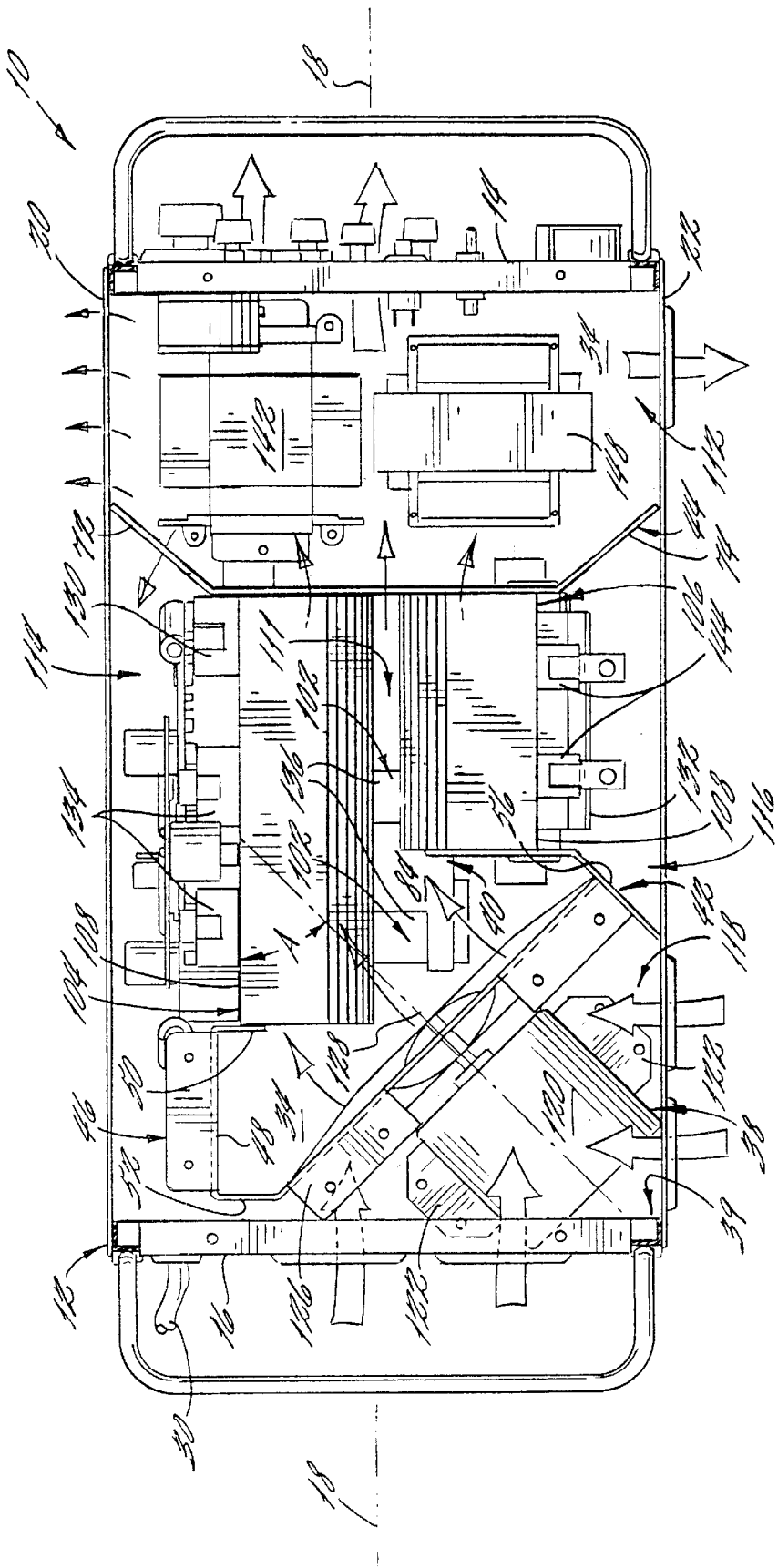

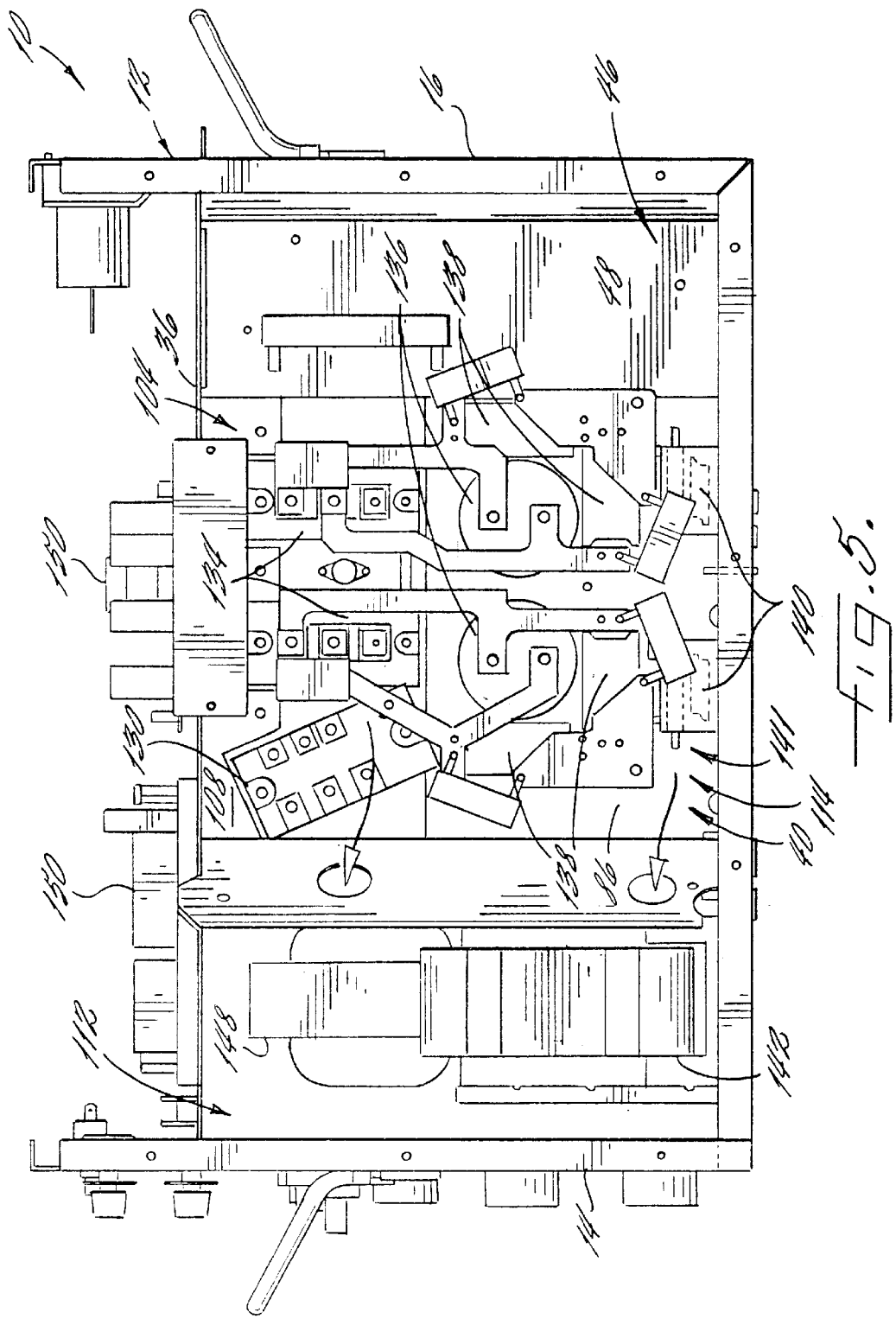

POWER SUPPLY WITH OBLIQUELY IMPINGING AIRFLOW

FIELD OF THE INVENTION

The present invention relates generally to an electrical power supply, and more particularly relates to cooling the electrical components of a power supply of a piece of equipment that produces an electrical arc, such as an arc welder or a plasma arc torch.

BACKGROUND OF THE INVENTION

The production of an electric arc is central to the operation of arc welders and plasma arc torches. Arc welders and plasma arc torches include a power supply that creates a potential difference between an electrode and a workpiece so that an electric arc is produced between the electrode and the workpiece.

Arc welders are used for joining metal workpieces and can be generally categorized into three basic types; manual "stick electrode" arc welders, MIG welders and TIG welders. With conventional stick electrode arc welding, a consumable coated rod or stick of metal, which functions as the anode, is placed adjacent to the workpiece being welded, which functions as the cathode. An arc is generated between the anode and the workpiece to form a weld bead and join the workpiece to another workpiece. The heat of the arc transfers filler metal from the anode to the workpieces to form the weld bead. After the anode has been consumed, it must be replaced with a new anode. MIG (Metal-Inert Gas) welding is similar, except that an inert or slightly oxidizing gas is supplied to shield the arc from the atmosphere and improve the metallurgical qualities of the weld. TIG (Tungsten-Inert Gas) welding is similar to MIG welding, except a non-consumable tungsten anode is used. Filler material may be supplied by way of an adjacent consumable rod.

Plasma arc torches are commonly used for cutting, welding, surface treating, melting, or annealing a metal workpiece. Such working of the workpiece is facilitated by a plasma arc that extends from the plasma arc torch to the workpiece. The plasma arc is formed by introducing a gas to an electrical arc extending between the plasma arc torch and the workpiece, such that the electrical arc ionizes the gas to create the plasma arc.

The power supply of an arc welder or a plasma arc torch typically includes an input line that is connected to a conventional supply of electric power, such as household or industrial alternating current. The power supply also includes two output terminals. One of the terminals is electrically connected to an anode, such as by way of an electrode holder, and the other of the terminals is connected to the workpiece to produce an electric arc between the anode and the workpiece. The power supply typically includes a housing that contains the various electrical components of the power supply. The housing typically includes one or more cover panels that shield the electrical components from the operator.

Some of the electrical components of the power supply can generate large amounts of heat. Accordingly, many conventional power supplies include a cooling fan that forces air through the power supply to cool the electrical components. It is common in such power supplies for heat sinks that are connected to electrical components to be elongate and thereby define a longitudinal axis. It is also common for the cooling fan to define a flowpath with a flow axis, and for the flow axis to be parallel to the longitudinal axis. As a result, the flow of air through the power supply is parallel to the cooling surfaces of the heat sinks and can be utilized to cool one or more heat dissipating components downstream from the heat sinks. Advances in power supply design, such as power, size, etc., often demand greater and greater heat removal capabilities.

However, it has been discovered that cooling flow that is parallel to a surface being cooled such as in the conventional power supplies discussed above is not as effective at removing heat as a cooling flow that is perpendicular to, and thereby fully impinging upon, the surface being cooled. For example, a flow of air directed perpendicularly to a finned surface of a heat generating device (that is, fully-impinging airflow) removes more heat than a flow of air directed parallel to the fins. However, it can be difficult or inefficient for fully-impinging airflow to be effectively used to cool components that are distant from the component receiving the fully-impinging airflow. For example, it is common for a fully-impinging airflow to define a single flow axis upstream from the component receiving the fully-impinging airflow. However, the flow of air is subsequently dispersed typically in various directions and therefore is difficult to use for the purpose of directing a substantial portion of the airflow toward another component to be cooled.

Thus, conventional power supplies are limited in the amount of heat removal possible because of the use of a cooling airflow parallel to the longitudinal axes of the heat sinks. However, it has not previously been feasible to stray from the parallel airflow design because of the desire to also cool downstream components with the cooling airflow. Accordingly, there is a great need in the industry for a power supply having improved airflow cooling relative to conventional power supplies which allows for the cooling of downstream components.

SUMMARY OF THE INVENTION

The present invention solves the problems identified above and provides other advantages, for example by applying an obliquely impinging airflow against primary heat sink components. More particularly, the present invention comprises a power supply for an arc welder or a plasma arc torch, or the like, that includes a housing having at least one air inlet and at least one air outlet, and an air moving device for moving cooling air from the air inlet to the air outlet along a flowpath extending through the housing. A primary heat dissipator extends in a longitudinal direction and is positioned within the flowpath. The primary heat dissipator is oriented in the flowpath so that an upstream section of the flowpath has a flow axis that defines an acute angle with respect to the longitudinal direction, and so that air flowing from the upstream section of the flowpath impinges upon and is deflected by the primary heat dissipator toward and along a downstream section of the flowpath that has a flow axis that extends generally in the longitudinal direction. A secondary heat dissipator is positioned within the flowpath downstream from the primary heat dissipator. That is, the present invention advantageously utilizes obliquely impinging airflow against a primary heat dissipator to enhance the convective heat transfer between the primary heat dissipator and the airflow. Further, the primary heat dissipator is positioned to divert the airflow toward a secondary heat dissipator that is downstream from the primary heat dissipator, so that the secondary heat dissipator can also be cooled.

In accordance with one aspect of the invention, the primary heat dissipator is a heat sink that includes a plurality of fins that extend in the longitudinal direction. The heat sink is connected to a heat generating electrical component, and the secondary heat dissipator is another heat generating electrical component. In accordance with another aspect of the invention, the primary heat dissipator is a wall, which comprises a panel carrying a plurality of electrical components.

In accordance with another aspect of the invention, the primary heat dissipator is a first heat sink, and a second heat sink extends in the longitudinal direction and is laterally displaced from the first heat sink so that a passageway is at least partially defined between the first heat sink and the second heat sink. At least a portion of the downstream section of the flowpath extends through the passageway. The upstream ends of the heat sinks define a staggered arrangement, which is characterized by the end of one of the heat sinks extending beyond the end of the other heat sink. That staggered arrangement allows for air flowing from the upstream section of the flowpath to impinge at an acute angle upon a substantial length of the first heat sink. Further, the air moving device is positioned in a corner of the housing that is opposite from the staggered arrangement, so that the air moving device can readily direct semi-impinging flow against the first heat sink, and so that the size of the power supply can be minimized.

The present invention advantageously utilizes obliquely impinging airflow against the primary heat dissipator, because the obliquely impinging airflow is more effective at removing heat than airflow that is parallel to the primary heat dissipator. Further, the obliquely impinging airflow is diverted by the primary heat dissipator toward a secondary heat dissipator that is downstream from the primary heat dissipator. Therefore, the present invention provides the advantages of impinging flow with respect to the primary heat dissipator, and the advantages of parallel flow with respect to the secondary heat dissipator.

BRIEF DESCRIPTION OF THE DRAWINGS

For a more complete understanding of this invention, reference should now be made to the preferred embodiment illustrated in the accompanying drawings, which are described below.

FIG. 1 is a perspective view of an arc welder power supply that shows the front, top and right side of the power supply, according to the present invention.

FIG. 2 is a perspective view that shows the rear, top and left side of the power supply.

FIG. 3 is a schematic view similar to FIG. 2, except that top, right and left panels of the power supply are removed.

FIG. 4 is a schematic top plan view of the power supply with the top panel and an intermediate panel, and components associated therewith, removed.

FIG. 5 is a schematic right elevation view of the power supply with the top, right and left panels removed.

DETAILED DESCRIPTION OF THE PREFERRED EMBODIMENT

Figure 6:
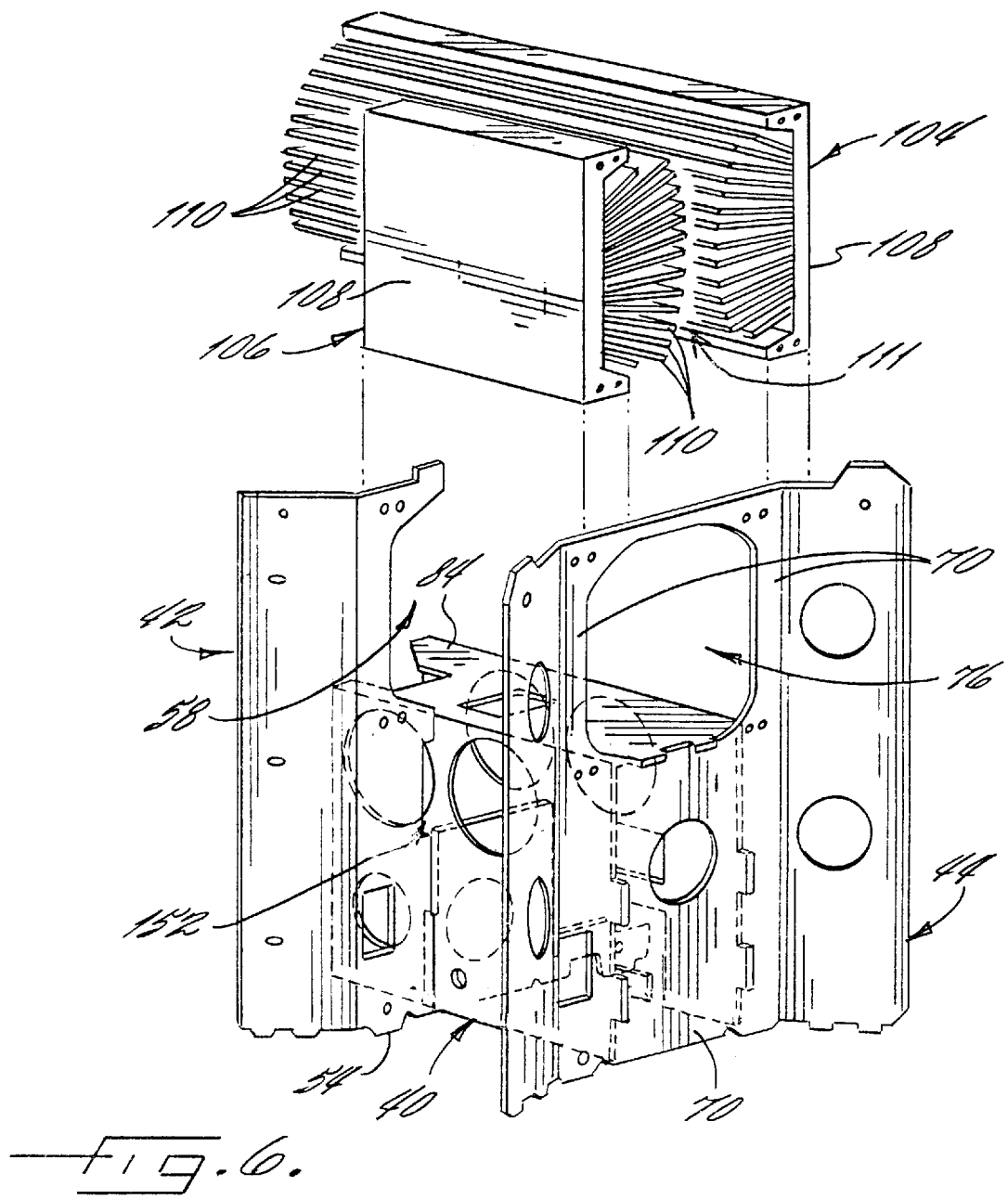
FIG. 6 is a front perspective view of a portion of a support assembly of the power supply, with heat sinks of the power supply exploded away from the support assembly.

The present invention now will be described more fully hereinafter with reference to the accompanying drawings, in which the preferred embodiment of the invention is shown. This invention may, however, be embodied in many different forms and should not be construed as limited to the embodiment set forth herein; rather, this embodiment is provided so that the disclosure will be thorough and complete, and will fully convey the scope of the invention to those skilled in the art. Like numbers refer to like elements throughout.

FIGS. 1 and 2 illustrate a power supply apparatus of a piece of equipment that produces an electrical arc, or more particularly a power supply of an arc welder, the power supply being indicated generally at 10. The power supply 10, or a slight variation thereof, can function as a power supply of a plasma arc torch. The power supply 10 includes a housing 12 having a front panel 14 and a rear panel 10. The housing 12 further includes a right panel 20, a left panel 22 and a top panel 24. Multiple air inlet openings 26, which may be in the form of louvers, are defined by the rear panel 16 and the left panel 22. Similarly, multiple air outlet openings 28, at least some of which may be in the form of louvers, are defined through the front panel 14, right panel 20 and left panel 22.

The housing 12 can be characterized as defining a longitudinal axis 18 that extends from the front panel 14 to the rear panel 16, and that provides a frame of reference. That is, for purposes of this detailed description of the preferred embodiment, "longitudinal direction" or "longitudinally" is defined as the direction of the longitudinal axis 18, and "lateral direction" or "laterally" is defined as the horizontal direction that is perpendicular to the longitudinal axis 18. These directions are defined with respect to the longitudinal axis 18 to clarify the detailed description of the preferred embodiment, and not for purposes of limitation.

Electricity is provided to the power supply 10 by way of a power cord 30 that extends from the rear panel 16, and electricity is supplied from the power supply 10 by way of output terminals 32 that are mounted on the front panel 14. More specifically, the power supply 10 is readied for use by connecting the power cord 30 to a conventional supply of electric power, such as household or industrial alternating current. In use, one of the output terminals 32 is electrically connected in a conventional manner to an electrode (not shown), such as by way of an electrode holder, and the other of the terminals 32 is connected in a conventional manner to a workpiece (not shown) to produce an electric arc (not shown) between the electrode and the workpiece, as should be understood by those skilled in the art.

The front panel 14 may further include an off/on switch and one or more voltage meters or amperage meters to inform the operator of the power supply 10 of the characteristics of the electricity available from the terminals 32. The front panel 14 may also include several resettable circuit breakers, a voltage output control knob and other items that are conventionally provided on the front panel of a power supply of an arc welder or a plasma arc torch.

FIG. 3 is a schematic perspective view of the power supply 10 with the right panel 20 (FIG. 1), left panel 22 (FIG. 2) and top panel 24 (FIGS. 1 and 2) removed. The housing 12 further includes a bottom panel 34 and an intermediate panel 36. An air moving device, such as a fan assembly 38, is advantageously mounted in an interior and vertically extending corner 39 of the housing 12 that is defined between the left panel 22 and the rear panel 16, as will be discussed in greater detail below. As indicated by the large arrows in FIGS. 1–3, air is drawn into the housing 12 through the air inlet openings 26 and forced out of the housing through the air outlet openings 28 while the fan assembly 38 is operating. Thus, a flowpath extends through the housing 12 between the air inlet openings 26 and the air outlet openings 28. The flowpath can provide a frame of reference, as should be understood by those skilled in the art. That is, the term "downstream" generally means in the direction that air flows along the flowpath, whereas the term "upstream" generally means the opposite direction.

A support assembly is located within the housing 12 for supporting many of the components of the power supply 10. As illustrated in FIG. 3, the support assembly includes a channel 40, a rear baffle 42 and a front baffle 44. As best seen in FIGS. 4 and 5, the support assembly also includes a rear baffle 46. FIG. 4 is a schematic top plan view of the power supply 10 with the top panel 24 (FIGS. 1 and 2), the intermediate panel 36 (FIG. 3) and components carried by the intermediate panel removed. FIG. 5 is a schematic right elevation view of the power supply 10 with the right panel 20 (FIG. 1), left panel 22 (FIG. 2) and top panel 24 removed. The rear baffle 46 includes a longitudinally extending main portion 48 (FIG. 5), a laterally extending forward flange 50 (FIG. 4) and a laterally extending rearward flange 52 (FIG. 4). The flanges 50, 52 extend only a short distance from the main portion 48.

Figure 7:
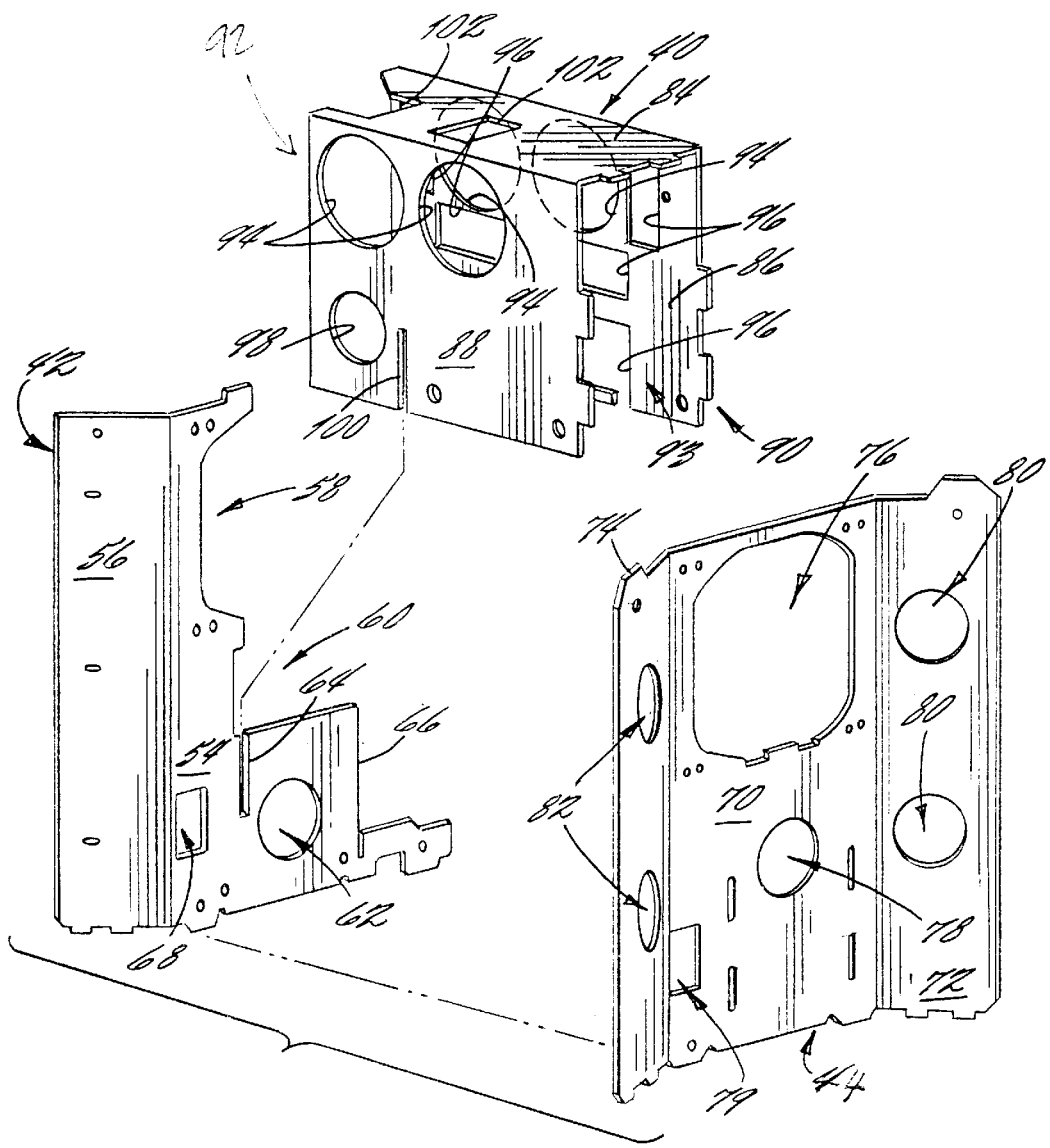
FIG. 7 is a front perspective, exploded view of the portions of the support assembly illustrated in FIG. 6.

The channel 40, rear baffle 42 and front baffle 44 of the support assembly are best seen in FIGS. 6 and 7. FIG. 6 illustrates the channel 40, rear baffle 42 and front baffle 44 in an assembled configuration, whereas FIG. 7 illustrates those components in an exploded configuration. As best seen in FIG. 7, the rear baffle 42 includes a left portion 56 that extends angularly from a laterally extending center portion 54. The center portion 54 defines an upper open area 58, a middle open area 60 and a lower opening 62. Further, a vertical slot 64 is laterally displaced from an upright edge 66 of the center portion 54. The center portion 54 further defines a receptacle opening 68. The front baffle 44 includes and a right portion 72 and a left portion 74 that extend angularly from a laterally extending center portion 70. The center portion 70 defines an upper opening 76 and a lower opening 78. The center portion 70 further defines a receptacle opening 79. The right portion 72 defines side openings 80 and the left portion 74 defines side openings 82.

The channel 40 is a somewhat U-shaped channel that is inverted and extends generally in the longitudinal direction. The channel 40 includes a top panel 84, a right panel 86 and a left panel 88. The channel 40 defines an open front end 90 and an open rear end 92. A lower passageway 93, which extends between the front end 90 and the rear end 92, is defined through the channel 40 and is partially defined between the panels 84, 86, 88. The lower passageway 93 is also defined by a portion of the lower panel 34 (FIG. 3) to which the channel 40 is mounted. The right panel 86 and the left panel 88 each define a pair of circular receptacle openings 94. The right panel 86 further defines six generally rectangular receptacle openings 96, only five of which are partially seen in FIG. 7. The left panel 88 further defines an air opening 98 and a vertical slot 100. The top panel 84 defines a pair of air openings 102.

As illustrated in FIG. 6, the channel 40 is mounted to the rear baffle 42 by mating the slots 64, 100 (FIG. 7) so that the upright edge 66 (FIG. 7) of the rear baffle abuts the inside surface of the right panel 86 (FIG. 7) of the channel 40. The front end 90 (FIG. 7) of the channel 40 is mounted to the rear surface of the center portion 70 of the front baffle 44. Once the channel 40 is properly mounted to the front baffle 44 and the rear baffle 42 is illustrated in FIG. 6, that assembly is mounted to the bottom panel 34 (FIG. 3), so that the lower passageway 93 (FIG. 7) is defined, as described above. Referring to FIG. 7, the lower passageway 93 further extends through the middle open area 60 and the lower opening 62 of the rear baffle 42, and the lower opening 78 of the front baffle 44.

Referring back to FIG. 6, many components of the power supply 10 are carried by the support assembly, which includes the channel 40, rear baffle 42, front baffle 44 and rear baffle 46 (FIGS. 4 and 5). For example, a right heat sink 104 and a left heat sink 106 that extend in the longitudinal direction and are laterally displaced from one another are mounted to the support assembly. Each heat sink 104, 106 includes a somewhat C-shaped base 108 and a plurality of fins 110 that extend somewhat radially from the base and toward the opposite heat sink. Further, each heat sink 104, 106 and each fin 110 is elongate and therefore has a longitudinal axis, and the longitudinal axis of each heat sink and each fin is generally parallel to the longitudinal axis 18 (FIGS. 1,2 and 3).

The lower edges of the bases 108 rest upon the top panel 84 of the channel 40. The front end of the base 108 of the right heat sink 104 is mounted to the upper right portion of the center portion 70 of the front baffle 44. As best seen in FIG. 4, the rear end of the base 108 of the right heat sink 104 is mounted to the forward flange 50 of the rear baffle 46. Referring back to FIG. 6, the front end of the base 108 of the left heat sink 106 is mounted to the upper left portion of the center portion 70 of the front baffle 44. The rear end of the base 108 of the left heat sink 106 is mounted to the upper portion of the center portion 54 of the rear baffle 42.

The bottom surface of the intermediate panel 36 (FIG. 3) abuts the top surfaces of the bases 108, the top edge of the rear baffle 42, the top edge of the front baffle 44, and the top end of the rear baffle 46 (FIGS. 4 and 5), which is in the form of a flange. Thus, an upper passageway 111 (also see FIG. 4) that is open proximate to the front and rear ends of the heat sinks 104, 106 is defined between the heat sinks, the top panel 84 of the channel 40 and the bottom surface of the intermediate panel 36. The upper passageway 111 is aligned with, and may be characterized as including, the upper open area 58 defined by the rear baffle 42 and the upper opening 76 defined by the front baffle 44. As best seen in FIG. 4, the upper passageway 111 and the lower passageway 93 (FIG. 7) can communicate, to at least a limited extent, through the air openings 102 defined through the top panel 84 of the channel 40.

As best seen in FIG. 4, a front chamber 112 is at least partially defined between the front baffle 44, the front panel 14 and forward portions of the right panel 20, left panel 22, bottom panel 34 and intermediate panel 36 (FIGS. 3 and 5). A right chamber 114 is at least partially defined between the right portion 72 of the front baffle 44, a portion of the bottom panel 34, base 108 of the right heat sink 104, right panel 86 (FIG. 7) of the channel 40, and a portion of the right panel 20. A left chamber 116 is at least partially defined between the left portion 56 of the rear baffle 42, left portion 74 of the front baffle 44, a portion of the bottom panel 34, base 108 of the left heat sink 106, a portion of the left panel 88 (FIG. 7) of the channel 40, and a portion of the left panel 22. The right chamber 114 and the left chamber 116 are not closed by the intermediate panel 36. A rear chamber 118 is at least partially defined between the rear baffle 42, rear baffle 46, rear panel 16, and rear portions of the left panel 22, bottom panel 34 and intermediate panel 36.

The fan assembly 38 includes a motor 120 that extends far into the corner 39. The motor 120 is mounted to vertically extending mounting brackets 122. The fan assembly 38 also includes an impeller 124 (FIG. 3) that is carried by a shaft of the motor 120 and rotated by the motor. The impeller 124 rotates within an opening defined by a shroud 126 that is mounted to the left portion 56 of the rear baffle 42, flange 52 of the rear baffle 46, bottom panel 43 and intermediate panel 36 (FIGS. 3 and 5). The fan assembly 38 defines a flow axis 128, which is also the axis about which the impeller 124 rotates and the cylindrical axis of the motor 120.

A main electrical path extends through a group of electrical components that are within the housing 12 (FIGS. 1 and 2) and are electrically connected in a conventional manner between the power cord 30 (FIG. 14) and the output terminals 32 (FIG. 1). The components in the main electrical path operate in a conventional manner to convert from a conventional type of electric power, such as household or industrial alternating current, to a current that is suitable for a piece of equipment that produces an electrical arc, such as an arc welder or a plasma arc torch. That is, household or industrial alternating current is supplied to the power supply 10 by the power cord 30, and the main group of electrical components electrically function in a conventional manner to provide current to the terminals 32. Because the main group of electrical components are conventional in the manner in which they are electrically connected and electrically operate, or are not pertinent to the present invention, the electrical aspects of those components are not discussed in detail and some of the associated electrical connections are not shown.

As best seen in FIGS. 4 and 5, the main group of electrical components includes an input bridge 130 that receives the alternating current introduced to the power supply 10 by the power cord 30. The input bridge 130 is mounted to the base 108 of the right heat sink 104 and is located in the right chamber 114. Heat generated by the input bridge 130 is conducted to and dissipated by the right heat sink 104. The input bridge 130 includes a series of diodes and converts the alternating current to a direct current. Thereafter, the direct current is supplied to an inductor 132, which is best seen in FIG. 3. The opposite ends of the inductor 132 fit into and fill the receptacle opening 68 (FIG. 7) of the rear baffle 42 (FIG. 7) and the receptacle opening 79 (FIG. 7) of the front baffle 44 (FIG. 7). The inductor 132 smoothes the direct current.

Thereafter, the direct current is supplied to an inverter that includes multiple electrical components that are best seen in FIG. 5. The inverter converts the direct current to a high frequency alternating current. The inverter includes at least one, and preferably a pair of IGBTs 134 (also see FIG. 4) that are mounted to the base 108 of the right heat sink 104 and are located in the right chamber 114. Heat generated by the IGBTs 134 is conducted to and dissipated by the right heat sink 104. The IGTBs 134 may be in parallel or series, depending upon the specific application of the power supply 10. The inverter also includes at least one, and preferably a pair of cylindrical capacitors 136. Each of the cylindrical capacitors 136 fits into and spans between a laterally displaced pair of the circular receptacle openings 94 (FIG. 7). Therefore, each of the cylindrical capacitors 136 extends laterally between the right panel 86 (FIG. 7) and the left panel 88 (FIG. 7) of the channel 40 and through the lower passageway 93 (FIG. 7). In FIG. 4, the cylindrical capacitors 136 are seen through the air openings 102 defined through the top panel 84 of the channel 40.

As best seen in FIG. 5, the inverter also includes at least one, and preferably four somewhat rectangular capacitors 138. Each of the rectangular capacitors 138 fits into a respective one of the rectangular receptacles 96 (FIG. 7) defined in the right panel 86 of the channel 40. For each of the rectangular capacitors 138, one side thereof faces the right chamber 114, whereas the opposite side extends a short distance into the lower passageway 93 (FIG. 7). The inverter also includes at least one, and preferably two heat dissipators 140. Each of the heat dissipators 140 fits into a respective one of the rectangular receptacles % (FIG. 7) defined in the right panel 86 of the channel 40. Each heat dissipator 140 includes one or two resistors that face the right chamber 114 and are mounted to a heat sink having a pair of fins that extend a short distance into the lower passageway 93.

The sides of the rectangular capacitors 138 and the heat dissipators 140 that extend into the lower passageway 93, in conjunction with the right panel 86 that carries those components, can be together characterized as a composite heat dissipating wall 141. The side of the composite heat dissipating wall 141 that faces the lower passageway 93 is not shown, but the opposite side of the composite heat dissipating wall is seen in FIG. 5.

Referring to FIGS. 4 and 5, the high frequency alternating current from the inverter is routed to a main transformer 142, which further increases the magnitude of the alternating current. Thereafter, the alternating current is supplied to a pair of diodes 144, which are best seen in FIGS. 3 and 4. The diodes 144 are mounted to the base 108 of the left heat sink 106 and are within the left chamber 116. Heat generated by the diodes 144 is conducted to and dissipated by the left heat sink 106. The diodes 144 are not electrically insulated from the left heat sink 106; therefore, the left heat sink 106 becomes electrically charged. Accordingly, with the exception of the diodes 144, the components that contact the left heat sink 106 are preferably constructed of an electrically insulating material. The diodes 144 convert the alternating current to a direct current. Thereafter, the direct current is smoothed by an inductor 146, which is best seen in FIG. 3. The inductor 146 is mounted within the front chamber 112. The direct current is supplied from the inductor 146 to the output terminals 32 (FIG. 1).

The power supply 10 also includes another group of electrical components that operate in a conventional manner. This other group of electrical components includes a control transformer 148, which is best seen in FIGS. 3 and 4. The control transformer 148 converts the alternating current received from the power cord 30 (FIGS. 1–4) to a current that is used to operate the fan assembly 38 (FIGS. 3 and 4) and the conventional control system of the power supply 10. Referring to FIGS. 3 and 5, the conventional control system of the power supply 10 includes circuit boards 150, or the like, that are mounted on the upper surface of the intermediate panel 36.

Each of the above-discussed right heat sink 104, left heat sink 106, input bridge 130, inductor 132, IGBTs 134, cylindrical capacitors 136, rectangular capacitors 138, heat dissipators 140, main transformer 142, diodes 144, inductor 146 and control transformer 148 can be characterized as a heat dissipator, because either directly or indirectly they release heat to the flowpath that extends through the housing 12. Further, each of the right heat sink 104, left heat sink 106, input bridge 130, IGBTs 134, cylindrical capacitors 136, rectangular capacitors 138, heat dissipators 140 and diodes 144 can be characterized as a primary heat dissipator because they are positioned upstream from the main transformer 142, inductor 146 and control transformer 148, which can be characterized as secondary heat dissipators.

Reference should be made primarily to FIG. 4 throughout the remainder of this disclosure. The flowpath includes an upstream section that extends from the impeller 124 and along the flow axis 128 (that is, the upstream section of the flowpath defines the flow axis 128). The upstream section of the flowpath extends to proximate the upstream portion of the right heat sink 104 and to proximate the upstream portion of the composite heat dissipating wall 141 (FIG. 5). The upstream portion of the right heat sink 104 at least partially defines the inlet to the upper passageway 111, and the upstream portion of the composite heat dissipating wall 141 at least partially defines the inlet to the lower passageway 93 (FIG. 7). The flowpath is funneled or constricted into the lower and upper passageways 93, 111 by the rear baffles 42, 46.

The upper passageway 111 and the lower passageway 93 (FIG. 7) are generally separate, such that the flowpath is bifurcated and includes separate upper and lower downstream sections of the flowpath that are downstream from the upstream section of the flowpath. The upper downstream section of the flowpath extends through at least a downstream portion of the upper passageway 111 and is therefore adjacent to the downstream portions of the heat sinks 104, 106. The lower downstream section of the flowpath extends through at least a downstream portion of the lower passageway 93 and is therefore adjacent to the downstream portion of the composite heat dissipating wall 141. The upper and lower downstream sections of the flowpath each extend generally parallel the longitudinal axis 18.

The flow axis 128 of the upstream section of the flowpath intersects and extends in a common plane with the longitudinal axis 18, so that an acute angle is defined between the flow axis 128 of the upstream section of the flowpath and the longitudinal axis 18. That acute angle is preferably in the range of approximately 20 to approximately 70 degrees, and is most preferably approximately 45 degrees. The surfaces of the right heat sink 104 that are in a convective heat transfer relationship with the portion of the flowpath that extends through the upper passageway 111 extend in the longitudinal direction, so that an acute angle A is defined between the flow axis 128 of the upstream section of the flowpath and the right heat sink 104. The angle A is preferably in the range of approximately 20 to approximately 70 degrees, and more particularly approximately 45 degrees. As a result of this angular relationship and the longitudinally extending nature of the right heat sink 104, air flowing from the upstream section of the flowpath impinges upon the right heat sink at an angle that is approximately equal to the angle A (to define what can be characterized as an obliquely impinging airflow) and is deflected by the right heat sink toward and along the upper downstream section of the flowpath, which has a flow axis that extends generally in the longitudinal direction.

The combination of the obliquely impinging airflow at the upstream portion of the right heat sink 104 and the more parallel flow proximate to the downstream portion of the right heat sink provides for more conductive heat transfer between the right heat sink 104 and the air flowing therepast than would airflow that extends solely parallel to the right heat sink 104. For example, the obliquely impinging airflow very effectively penetrates to the base or roots of the fins 110 (FIG. 6) of the right heat sink 104, which is where the fins originate from their respective base 108. The obliquely impinging airflow also causes turbulence in the vicinity of the right heat sink 104 that mixes the cooling airflow in a manner that tends to diminish the formation of an insulating boundary layer of air proximate to the right heat sink, so that the convective heat transfer from the right heat sink is enhanced. That turbulence or associated turbulence resulting from the obliquely impinging airflow is also believed to similarly enhance the convective heat transfer from the left heat sink 106.

The obliquely impinging airflow also provides advantages over a fully-impinging airflow, which can be characterized as air flowing perpendicularly against a heat dissipator. For example, it is common for a fully-impinging airflow to define a single flow axis upstream from the heat dissipator receiving the fully-impinging airflow, but downstream from that heat dissipator it is common for the flow of air to be dispersed and therefore difficult to collect for the purpose of directing a substantial portion of the airflow toward a downstream component for cooling purposes. Also, it is believed that the pressure drop associated with an obliquely impinging airflow is less than the pressure drop associated with a corresponding fully-impinging airflow.

The advantages achieved by the present invention with respect to the obliquely impinging airflow relative to the heat sinks 104, 106 are enhanced because the upstream ends of the heat sinks are staggered. That is, the upstream end of the left heat sink 106 is displaced from the rear panel 16 farther than the upstream end of the right heat sink 104 is displaced from the rear panel, so hat the upstream ends of the heat sinks define a staggered arrangement. This staggered arrangement allows for air flowing from the upstream section of the flowpath to impinge upon a substantial length of the right heat sink 104, wherein that impinging occurs at an angle approximately equal to the angle A. This staggered arrangement also at least partially facilitates the placement of the fan assembly 38 in the corner 39, which provides a compact and beneficial arrangement for generating the airflow.

In accordance with the preferred embodiment of the present invention, the composite heat dissipating wall 141 (FIG. 5) extends generally in the longitudinal direction. Therefore, an acute angle, which corresponds to the angle A and is preferably in the range of approximately 20 to approximately 70 degrees and more particularly approximately 45 degrees, is defined between the flow axis 128 of the upstream section of the flowpath and the composite heat dissipating wall 141. As a result, air flowing from the upstream section of the flowpath impinges upon the composite heat dissipating wall 141 at an angle that is approximately equal to the angle A (to define what can be characterized as an obliquely impinging airflow) and is deflected by the composite heat dissipating wall toward and along the lower downstream section of the flowpath, which has a flow axis extending generally in the longitudinal direction. The advantages of the obliquely impinging airflow with respect to the composite heat dissipating wall 141 generally correspond to the above-discussed advantages of the obliquely impinging airflow with respect to the heat sinks 104, 106. Although obliquely impinging flow may occur to a lesser extent in the lower passageway 93 (FIG. 7) than the upper passageway 111 due to the lower passageway including more obstacles and being more restrictive to flow than the upper passageway, the lower passageway can be modified, such as by enlarging the lower opening 62 (FIG. 7) of the rear baffle 42, to enhance the obliquely impinging flow therein.

The advantages achieved by the present invention with respect to the obliquely impinging airflow at the composite heat dissipating wall 141 (FIG. 5) are enhanced by the air opening 98 (FIG. 7) defined through the left panel 88 (FIG. 7) of the channel 40. As is partially seen in FIG. 3, the air opening 98 increases the amount of air that can flow into the lower passageway 93 (FIG. 7) in a manner that will promote obliquely impinging flow with respect to the composite heat dissipating wall 141.

The semi-impinging airflow within the upper passageway 111 and the lower passageway 93 (FIG. 7) operates in conjunction with the upper and lower passageways being longitudinally extending so that the upper and lower downstream sections of the flowpath, which extend generally parallel to the longitudinal axis 18, extend from the upper and lower passageways into the front chamber 112. The upper and lower downstream sections of the flowpath are diffused by the front baffle 44 and extend into the front chamber 112 to cool the transformer 142, inductor 146 (FIG. 3) and control transformer 148. The upper and lower downstream sections of the flowpath extend toward the transformer 142, inductor 146 and control transformer 148 at least partially due to the arrangement of the front baffle 44 and portions of the lower panel 34, intermediate panel 36 (FIGS. 3 and 5), right panel 20 and left panel 22 that are proximate to the front baffle.

The upper passageway 111 is less restrictive to flow than the lower passageway 93 (FIG. 7); therefore, there is more flow through the upper passageway than the lower passageway. In some circumstances it is desirable to vary the ratio of flow between the upper passageway 111 and the lower passageway 93, in which case the lower passageway can be made less restrictive, for example by enlarging the lower opening 78 (FIG. 7) defined through the front baffle 44 and the lower opening 62 (FIG. 7) defined through the rear baffle 42. Similarly, the lower downstream section of the flowpath can be directed more toward a heat dissipator that requires additional cooling by repositioning the lower opening 62.

As the flowpath becomes proximate to the outlet openings 28 (FIGS. 1 and 2), the upper and lower downstream sections of the flowpath transition into a farther downstream section of the flowpath that includes three branches, one of which extends to the outlet openings 28 through the front panel 14, another of which extends to the outlet openings 28 through the right panel 20, and another of which extends to the outlet openings 28 through the left panel 22. The outlet openings 28 are arranged so that the farthest downstream portions of the flowpath are optimally positioned with respect to the transformer 142, inductor 146 and control transformer 148.

A majority of the flow through the power supply 10 is from the rear chamber 118 to the front chamber 112 by way of the upper passageway 111 and the lower passageway 93 (FIG. 7). However, some limited amount of the flow through the power supply 10 may reach the front chamber 112 by way of the left side chamber 116. For example, a limited amount of air flows directly from the rear chamber 118 to the left chamber 116 by way of a small opening 152 (FIG. 6) defined between the rear baffle 42 and the channel 40. That flow into the left chamber 116 at least partially cools the heat dissipators within the left chamber. A limited amount of air may flow from the left chamber 116 into the front chamber 112 through the side openings 82 (FIG. 7) defined through the front baffle 44.

Further, a recirculation flowpath, which extends through a passageway that is at least partially defined between the rear baffle 46 and portions of the rear panel 16 and the right panel 20, extends between the right chamber 114 and the suction side of the fan assembly 38. As a result, air may be drawn from the front chamber 112 into the right chamber 114 by way of the side openings 80 (FIG. 7), and air travels along the recirculation flowpath from the right chamber to the suction side of the fan assembly 38. Because the right chamber 114 may communicate with the left chamber 116 by way of a path that extends over the top of the intermediate panel 36 (FIGS. 3 and 5), air may flow over the top of the intermediate panel from the left chamber into the right chamber. As a result, air from the left chamber 116 may flow over the intermediate panel 36 and into the right chamber 114 and the recirculation flowpath, rather than flowing into the front chamber 112 by way of the side openings 82 (FIG. 7). Electrical cabling (not shown) extends through the side openings 80, 82, and if the cabling substantially occludes the side openings there will be little, if any, airflow through the side openings.

Many modifications and other embodiments of the invention will come to mind to those skilled in the art to which the invention pertains having the benefit of the teachings presented in the foregoing descriptions and the associated drawings. Therefore, it is to be understood that the invention is not to be limited to the specific embodiment disclosed and that modifications and other embodiments are intended to be included within the scope of the appended claims. Although specific terms are employed herein, they are used in a generic and descriptive sense only and not for the purposes of limitation. Further, the longitudinal and lateral directions were defined with respect to the longitudinal axis 18 (FIGS. 1 and 2) to clarify the detailed description of the preferred embodiment, and not for purposes of limitation.

That which is claimed:

1. A power supply apparatus for supplying electrical power for a piece of equipment that produces an electrical arc, the power supply apparatus comprising:

a housing having at least one air inlet and at least one air outlet;

an air moving device for moving cooling air from the air inlet to the air outlet along a flowpath extending through the housing; and a heat dissipator extending in a longitudinal direction, positioned along the flowpath, and comprising an upstream portion and a downstream portion, wherein the heat dissipator is oriented along the flowpath so that an upstream section of the flowpath is proximate to the upstream portion of the heat dissipator, said flowpath having a flow axis that forms an acute angle with respect to the longitudinal direction such that air flowing from the upstream section of the flowpath impinges upon and is deflected by the heat dissipator so as to create a downstream section of the flowpath that is proximate to the downstream portion of the heat dissipator and extends generally in the longitudinal direction.

2. A power supply apparatus as defined in claim 1, wherein the heat dissipator is a primary heat dissipator, the downstream section of the flowpath extends downstream from the primary heat dissipator and a secondary heat dissipator is positioned in the downstream section of the flowpath.

3. A power supply apparatus as defined in claim 1, further comprising at least one baffle positioned upstream from and proximate to the heat dissipator for constricting a portion of the flowpath and directing at least some of the air flowing in the flowpath toward the heat dissipator.

4. A power supply apparatus as defined in claim 1, further comprising at least one baffle downstream from and proximate to the heat dissipator for at least partially diffusing a portion of the flowpath.

5. A power supply apparatus as defined in claim 1, wherein the heat dissipator is a heat sink comprising a plurality of fins that extend in the longitudinal direction.

6. A power supply apparatus as defined in claim 1, wherein the heat dissipator comprises a panel and a plurality of heat dissipators carried by the panel.

7. A power supply apparatus as defined in claim 1, wherein the acute angle is in a range of approximately 20 to approximately 70 degrees.

8. A power supply apparatus as defined in claim 1, wherein the acute angle is approximately 45 degrees.

9. A power supply apparatus as defined in claim 2, further comprising a group of electrical components, wherein the secondary heat dissipator comprises at least one of the electrical components that generates heat, and the primary heat dissipator comprises a heat sink that is connected to at least one of the electrical components that generates heat.

10. A power supply apparatus as defined in claim 9, wherein the group of electrical components is operative for converting an alternating current to a direct current that is suitable for a piece of equipment that produces an electrical arc.

11. A power supply apparatus as defined in claim 1, wherein:

the heat dissipator comprises a first heat sink; and the power supply apparatus further comprises a second heat sink that extends generally in the longitudinal direction and is laterally displaced from the first heat sink so that a passageway is at least partially defined between the first heat sink and the second heat sink, wherein the passageway extends generally in the longitudinal direction and at least a portion of the downstream section of the flowpath extends through the passageway.

12. A power supply apparatus as defined in claim 11, wherein:

the housing comprises an upstream end and a downstream end, and the longitudinal direction extends from the upstream end of the housing to the downstream end of the housing;

the first heat sink comprises an upstream end and a downstream end; and the second heat sink comprises an upstream end and a downstream end, and the upstream end of the second heat sink is displaced from the upstream end of the housing farther than the upstream end of the first heat sink is displaced from the upstream end of the housing, so that the upstream ends of the first and second heat sinks define a staggered arrangement.

13. A power supply apparatus as defined in claim 11, further comprising:

an upstream baffle positioned upstream from and proximate to the first and second heat sinks for constricting a portion of the flowpath and directing at least some of the air flowing in the flowpath toward the first and second heat sinks; and a downstream baffle positioned downstream from and proximate to the first and second heat sinks for at least partially diffusing a portion of the flowpath and directing at least some of the air flowing in the flowpath toward the secondary heat dissipator, wherein each of the first heat sink and the second heat sink are mounted between the upstream baffle and the downstream baffle.

14. A power supply apparatus as defined in claim 11, wherein:

the passageway is a first passageway;

the power supply apparatus further comprises a second passageway positioned in parallel with first passageway and at least partially separated from the first passageway;

the flowpath is furcated so that a first branch of the flowpath extends through the first passageway and a second branch of the flowpath extends through the second passageway; and the power supply apparatus further comprises a plurality of heat generating electrical components, wherein the first heat sink is connected to at least one of the electrical components, the second heat sink is connected to at least one of the electrical components, and at least one of the electrical components is positioned in the second passageway.

15. A power supply apparatus as defined in claim 1, wherein:

the air moving device comprises a fan having a fan flow axis; and the housing comprises:

a first panel having peripheral edges, wherein the longitudinal direction is approximately perpendicular to the first panel, and a plurality of enclosing panels, each of which extends from adjacent a respective peripheral edge of the first panel and substantially perpendicularly away from the first panel in the longitudinal direction so that the first panel and the enclosing panels cooperate to at least partially define a chamber within which the fan is mounted such that an acute angle is defined between the fan flow axis and the longitudinal direction.

16. A power supply apparatus as defined in claim 15, wherein the acute angle defined between the fan flow axis and the longitudinal direction is in a range of approximately 20 to approximately 70 degrees.

17. A power supply apparatus as defined in claim 15, wherein the fan flow axis and the flow axis of the upstream section of the flowpath are parallel.

18. A power supply apparatus as defined in claim 15, wherein the fan comprises a motor and an impeller mounted to and rotated by the motor, wherein the motor is positioned within a corner defined between the first panel and at least one of the enclosing panels, such that the motor is positioned between the impeller and the corner.

19. A power supply apparatus for supplying electrical power for a piece of equipment that produces an electrical arc, the power supply apparatus comprising:

a housing comprising an upstream panel having peripheral edges, a downstream end opposite from the upstream panel, and a plurality of enclosing panels, wherein each of the enclosing panels extend from adjacent a respective peripheral edge of the upstream panel and substantially perpendicularly away from the upstream panel in a longitudinal direction that extends between the upstream panel and the downstream end, so that the upstream panel and the enclosing panels cooperate to at least partially define a chamber, and a corner is defined between at least one of the enclosing panels and the upstream panel;

an fan for moving cooling air from adjacent to the upstream panel to adjacent to the downstream end along a flowpath extending through the housing, wherein the fan comprises a motor positioned in the corner and an impeller mounted to and rotated by the motor and the fan defines a fan flow axis that is the flow axis of an upstream section of the flowpath and defines an acute angle with respect to the longitudinal direction; and a heat sink extending approximately in the longitudinal direction and comprising an upstream portion and a downstream portion, wherein the heat sink is oriented so that the upstream section of the flowpath is adjacent to the upstream portion of the heat sink, air flowing from the upstream section of the flowpath impinges upon and is deflected by the heat sink toward and along a downstream section of the flowpath that is proximate to the downstream portion of the heat sink, and the downstream section of the flowpath has a flow axis that extends substantially in the longitudinal direction.

20. A power supply apparatus as defined in claim 19, further comprising a heat dissipator positioned along the flowpath downstream from the heat sink.

21. A power supply apparatus as defined in claim 20, further comprising a plurality of heat generating electrical components, wherein the heat dissipator comprises at least one of the electrical components and the heat sink is connected to at least one of the electrical components.

22. A power supply apparatus as defined in claim 19, wherein:

the heat sink is a first heat sink, which further comprises an upstream end that is proximate to the impeller and an opposite downstream end; and the power supply apparatus further comprises a second heat sink that extends generally in the longitudinal direction, comprises an upstream end that is proximate to the impeller and an opposite downstream end, and is laterally displaced from the first heat sink so that a passageway is at least partially defined between the first heat sink and the second heat sink, wherein the passageway extends generally in the longitudinal direction and at least a portion of the downstream section of the flowpath extends through the passageway, and the upstream end of the second heat sink is displaced from the upstream panel farther than the upstream end of the first heat sink is displaced from the upstream panel, so that the upstream ends of the first and second heat sinks define a staggered arrangement that faces the corner in which the fan is positioned.

23. A method for cooling components of a power supply apparatus for supplying electrical power for a piece of equipment that produces an electrical arc, the method comprising the steps of:

moving cooling air along a flowpath within the power supply;

removing heat from a primary heat dissipator that extends in a longitudinal direction by orienting the primary heat dissipator along the flowpath so that an upstream section of the flowpath is proximate to an upstream portion of the primary heat dissipator and the upstream section of the flowpath has a flow axis that defines an acute angle with respect to the longitudinal direction, so that air flowing from the upstream section of the flowpath impinges upon and is deflected by the primary heat dissipator toward and along a downstream section of the flowpath that is proximate to a downstream portion of the primary heat dissipator, and the downstream section of the flowpath has a flow axis that extends generally in the longitudinal direction; and removing heat from a secondary heat dissipator by positioning the secondary heat dissipator within the flowpath downstream from the primary heat dissipator.

24. A method as defined in claim 23, wherein the secondary heat dissipator is positioned within the downstream section of the flowpath.

* * * * *